(12) United States Patent
Lee

(10) Patent No.: US 10,096,920 B2
(45) Date of Patent: Oct. 9, 2018

(54) POWER CONNECTOR AND ELECTRICAL TERMINAL ASSEMBLY THEREOF

(71) Applicant: Bellwether Electronic Corp, Taoyuan (TW)

(72) Inventor: Hsing-Yu Lee, Taoyuan (TW)

(73) Assignee: BELLWETHER ELECTRONIC CORP, Taoyuan (TW)

( * ) Notice: Subject to any disclaimer, the term of this patent is extended or adjusted under 35 U.S.C. 154(b) by 0 days.

(21) Appl. No.: 15/496,865

(22) Filed: Apr. 25, 2017

(65) Prior Publication Data

US 2017/0373419 A1  Dec. 28, 2017

Related U.S. Application Data

(60) Provisional application No. 62/354,145, filed on Jun. 24, 2016.

(51) Int. Cl.
| H01R 13/187 | (2006.01) |
| H01R 12/72 | (2011.01) |
| H01R 13/02 | (2006.01) |
| H01R 13/213 | (2006.01) |
| H01R 13/422 | (2006.01) |
| H05K 7/20 | (2006.01) |
| H01R 13/44 | (2006.01) |
| H01R 33/92 | (2006.01) |
| H01R 103/00 | (2006.01) |

(52) U.S. Cl.
CPC ......... *H01R 12/722* (2013.01); *H01R 12/724* (2013.01); *H01R 13/02* (2013.01); *H01R 13/187* (2013.01); *H01R 13/213* (2013.01); *H01R 13/4226* (2013.01); *H05K 7/2039* (2013.01); *H01R 13/44* (2013.01); *H01R 33/92* (2013.01); *H01R 2103/00* (2013.01)

(58) Field of Classification Search
CPC ............................. H01R 13/18; H01R 13/187
USPC ................................. 439/839, 845, 843, 851
See application file for complete search history.

(56) References Cited

U.S. PATENT DOCUMENTS

| 6,062,918 A * | 5/2000 | Myer | H01R 13/187 |
| | | | 439/833 |
| 7,766,706 B2 * | 8/2010 | Kawamura | H01R 13/112 |
| | | | 439/833 |
| 8,388,389 B2 * | 3/2013 | Costello | H01R 13/18 |
| | | | 439/637 |

(Continued)

*Primary Examiner* — Abdullah Riyami
*Assistant Examiner* — Thang Nguyen
(74) *Attorney, Agent, or Firm* — Li & Cai Intellectual Property (USA) Office

(57) ABSTRACT

A power connector includes an insulated housing and at least one electrical terminal assembly. The insulated housing has at least one terminal receiving hole. The at least one electrical terminal assembly is inserted in the at least one terminal receiving hole. Each electrical terminal assembly has an inner terminal, and an outer terminal. Each inner terminal has a connecting section, and an elastic section connected to the connecting section. Each outer terminal has a conductive portion, a leg portion arranged at one end of the conductive portion, and a curve portion arranged between the conductive portion and the leg portion. The leg portion is exposed outside of the insulated housing. The connecting section of the inner terminal is fixedly connected to the conductive portion of the outer terminal. The present disclosure further has an electrical terminal assembly.

20 Claims, 17 Drawing Sheets

(56) References Cited

U.S. PATENT DOCUMENTS

| | | | | |
|---|---|---|---|---|
| 8,449,338 B2* | 5/2013 | Gong | ............... | H01R 13/18 |
| | | | | 439/682 |
| 8,475,220 B2* | 7/2013 | Glick | ............... | H01R 13/113 |
| | | | | 439/839 |
| 8,939,787 B2* | 1/2015 | Kolbe | ............... | H01R 4/64 |
| | | | | 439/387 |
| 9,525,254 B2* | 12/2016 | Chen | ............... | H01R 27/02 |
| 2003/0060090 A1* | 3/2003 | Allgood | ............... | H01R 11/289 |
| | | | | 439/845 |
| 2003/0082957 A1* | 5/2003 | Mills | ............... | H01R 13/11 |
| | | | | 439/851 |
| 2011/0076901 A1* | 3/2011 | Glick | ............... | H01R 9/245 |
| | | | | 439/839 |
| 2012/0252283 A1* | 10/2012 | Muro | ............... | H01R 13/113 |
| | | | | 439/839 |
| 2014/0127954 A1* | 5/2014 | Ando | ............... | H01R 13/113 |
| | | | | 439/884 |
| 2014/0170912 A1* | 6/2014 | Ando | ............... | H01R 13/113 |
| | | | | 439/862 |
| 2016/0064848 A1* | 3/2016 | Yu | ............... | H01R 13/41 |
| | | | | 439/682 |

\* cited by examiner

POWER CONNECTOR AND ELECTRICAL TERMINAL ASSEMBLY THEREOF

BACKGROUND

1. Technical Field

The present disclosure is related to a power connector and electrical terminal assembly thereof, and in particular, to a power connector with a lower insertion force being able to stably transmit high current and an electrical terminal assembly thereof.

2. Description of Related Art

With the rapid development of electronic technology, electronic devices have increasing requirements for electric current. Thus, the power connector needs a stronger electrical terminal assembly with high current capability.

To transmit a high electric current, the electrical terminal assembly needs to be made of purer metallic copper, so as to provide better electrical conduction for avoiding electricity loss. The pure copper is softer and has better malleability, but its mechanical strength is poorer. Therefore, an additional terminal with better elasticity is needed to tightly clamp a terminal or an electrical modular card inserted therein for providing better electrical conduction. The additional terminal can be made of copper alloy. However, the problem needed to solve is how to combine two metallic terminals made of different materials to stably transmit a high electric current and reduce the insertion force.

SUMMARY

One objective of the present disclosure is to provide a power connector and an electrical terminal assembly thereof, wherein the electrical terminal assembly has an outer terminal with higher conductivity characteristic to stably transmit high current, and an inner terminal with an enough clipping force to elastically clip a terminal or a module card inserted therein with a lower insertion force.

Another objective of the present disclosure is to provide a power connector and an electrical terminal assembly thereof, and the electrical terminal assembly has heat-dissipating structure for dissipating residual heat when transmitting high current.

In order to achieve the above objectives, the present disclosure provides a power connector, which includes an insulated housing and at least one electrical terminal assembly. The insulated housing has at least one terminal receiving hole. The at least one electrical terminal assembly is disposed in the at least one terminal receiving hole. Each of the electrical terminal assemblies has an inner terminal, and an outer terminal. Each of the inner terminals has a connecting section, and an elastic section connected to the connecting section. Each of the outer terminals has a conductive portion, a leg portion formed at one end of the conductive portion, and a curve portion formed between the conductive portion and the leg portion. The leg portion is exposed outside the insulated housing. The connecting section of the inner terminal is fixedly connected to the conductive portion of the outer terminal.

In order to achieve the above objectives, the present disclosure further provides an electrical terminal assembly, which includes an inner terminal, and an outer terminal. Each of the inner terminals has a connecting section, and an elastic section connected to the connecting section. Each of the outer terminals has a conductive portion, a leg portion formed at one end of the conductive portion, and a curve portion connected the conductive portion and the leg portion. The conductive portion is plate-shaped. The leg portion is exposed outside the insulated housing. The connecting section of the inner terminal is fixedly connected to the conductive portion of the outer terminal.

In a preferred embodiment, the curve portion of the outer terminal has a plurality of heat-dissipating ribs.

In a preferred embodiment, electrical conductivity of the outer terminal is greater than that of the inner terminal, and an elastic modulus of the inner terminal is greater than that of the outer terminal.

In a preferred embodiment, the inner terminal further has a heat-dissipating section, and the heat-dissipating section is connected to the connecting section and opposite to the elastic section.

In conclusion, the present disclosure has advantages as follows. The embodiments according to the present disclosure provide the power connector and the electrical terminal assembly, which is suitable for the power connector for transmitting a high electric current. The elastic section of the inner terminal provides a better clamping force to elastically clamp a terminal or a modular card inserted therein to ensure a good electrical contact. The outer terminal can be made of a material with higher conductivity to transmit high current. The electrical terminal assembly of the present disclosure further provides a heat-dissipating structure which can be formed on the outer terminal or the inner terminal. The outer terminal can have a plurality of heat-dissipating ribs which are integrally protruded from a surface of the curve portion. The inner terminal can have a heat-dissipating section extended rearward so as to enlarge a heat-dissipating area.

For further understanding of the present disclosure, reference is made to the following detailed description illustrating the embodiments and examples of the present disclosure. The description is for illustrative purpose only and is not intended to limit the scope of the claim.

DETAILED DESCRIPTION OF THE EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

First Embodiment

Figure 1:
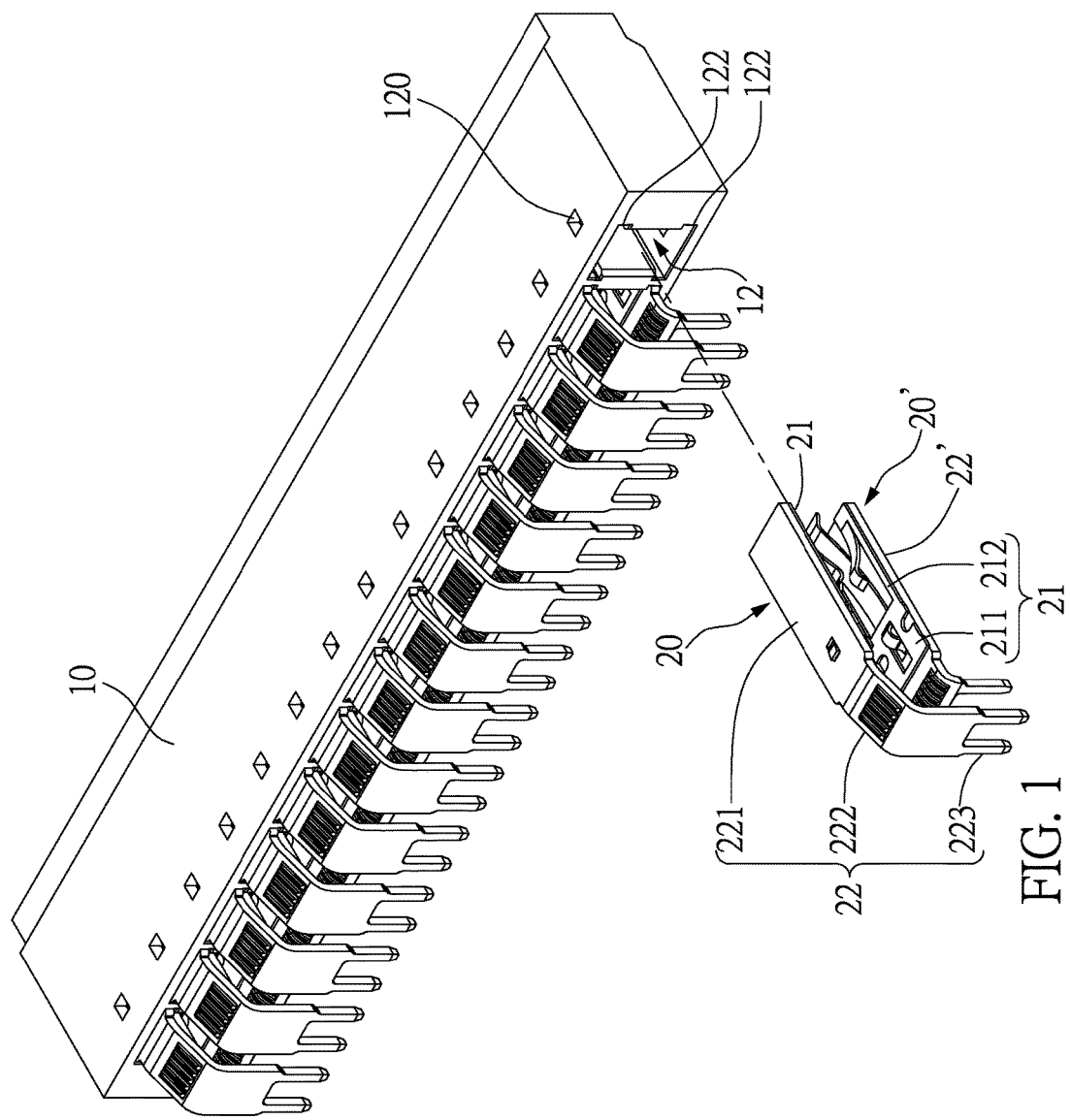
FIG. 1 is an exploded perspective view of a power connector according to a first embodiment of the present disclosure.
Figure 2:
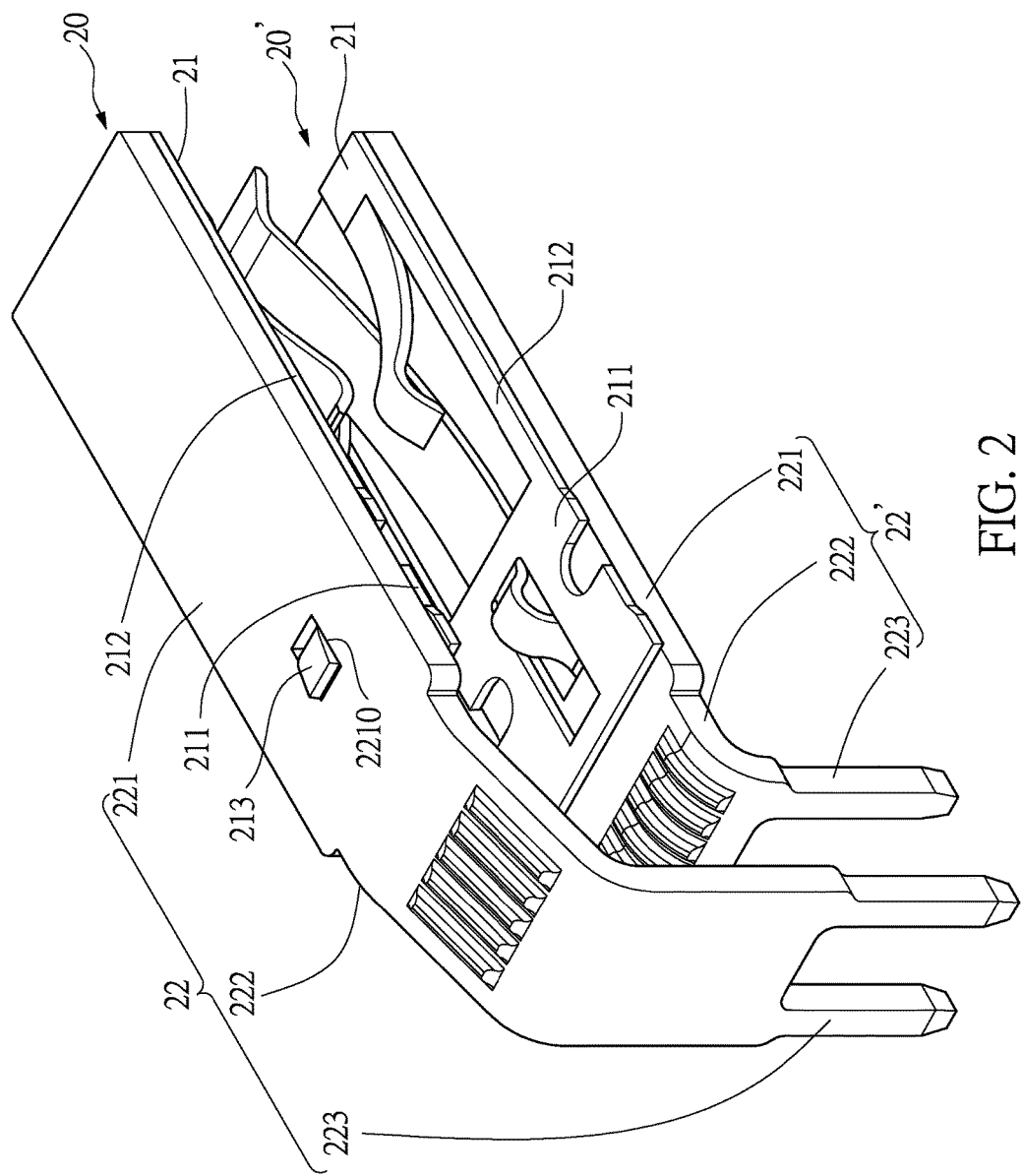
FIG. 2 is a perspective view of an electrical terminal assembly according to the first embodiment of the present disclosure.

Reference is made to FIG. 1 and FIG. 2. The present disclosure provides a perspective view of a power connector of a first embodiment, and a perspective view of a pair of electrical terminal assemblies of a first embodiment. The present disclosure provides a power connector 100 which has an insulated housing 10 and a pair of electrical terminal assemblies 20, 20'. The insulated housing 10 has a plurality of terminal receiving holes 12, and the terminal receiving holes 12 are formed along a longitudinal direction of the electrical terminal assembly 20 passing through the insulated housing 10. Each terminal receiving hole 12 has two opposite inserting slots 122 to receive a pair of electrical terminal assemblies 20, 20', respectively. The insulated housing 10 further has a plurality of wedging holes 120 respectively formed on and under the inserting slot 122. The inserting slot 120 is communicated with an exterior of the insulated housing 10 by means of the wedging hole 120. However, the number of the electrical terminal assembly and the terminal receiving hole can be at least one and is not limited by this embodiment.

In this embodiment, each pair of the electrical terminal assemblies 20, 20' has an inner terminal 21, 21 and an outer terminal 22, 22'. The upper inner terminal 21 of the electrical terminal assembly 20 is the same as the lower inner terminal 21 of the electrical terminal assembly 20'. The upper outer terminal 22 of the electrical terminal assembly 20 is slightly different from the lower outer terminal 22' of the electrical terminal assembly 20'. The difference is that a curve portion of the outer terminal 22' is smaller than a curve portion of the outer terminal 22. A slot is formed between the pair of the outer terminals 22, 22'. However, it is comprehensible that the present disclosure is not limited by the above description. The upper outer terminal can be the same as the lower outer terminal. The electrical terminal assembly 20 is introduced below as a representative of the present disclosure. In addition, the quantity of the electrical terminal assembly in this embodiment can be at least one. For example, in one of the terminal receiving holes 12, only one electrical terminal assembly 20 is disposed in an upper position of the inserting slot 122, and a lower position of the inserting slot 122 only has one outer terminal 22'. In another way, only one electrical terminal assembly 20' is disposed in a lower position of the inserting slot 122, and an upper position of the inserting slot 122 has only one outer terminal 22.

Figure 3:
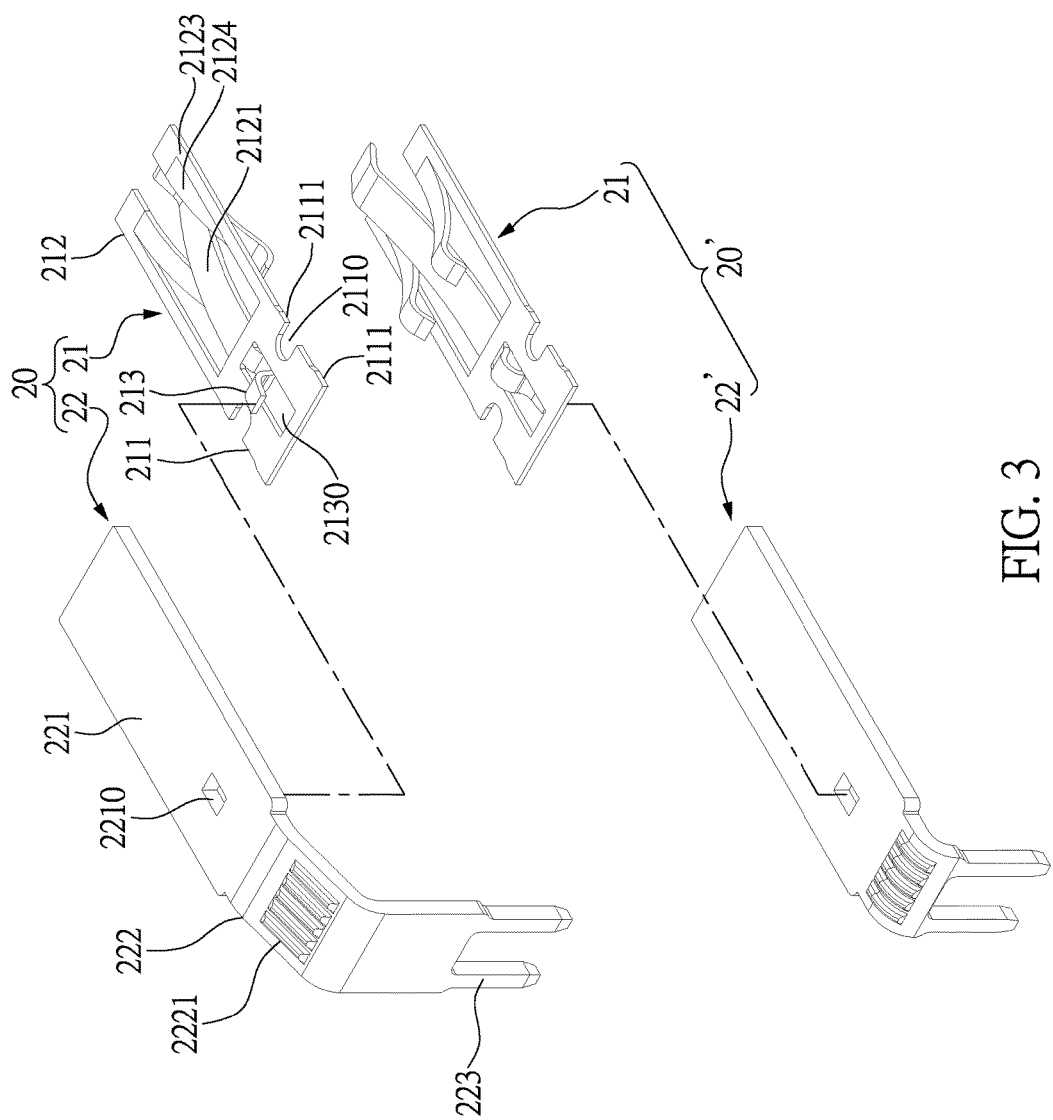
FIG. 3 is an exploded perspective view of the electrical terminal assembly according to the first embodiment of the present disclosure.

Reference is made to FIG. 2 and FIG. 3. The electrical terminal assembly 20 has an inner terminal 21 and an outer terminal 22. The inner terminal 21 has a connecting section 211, and an elastic section 212 connected with the connecting section 211. The outer terminal 22 has a conductive portion 221, a leg portion 223 formed at one end of the conductive portion 221, and a curve portion 222 formed between the conductive portion 221 and the leg portion 223. The conductive portion 221 is plate-shaped. The leg portion 223 is partially exposed beyond the insulated housing 10. The connecting section 211 of the inner terminal 21 is fixedly connected to conductive portion 221 of the outer terminal 22; in a preferable way, the connection can be made by soldering, but the present disclosure is not limited thereto. The elastic section 212 of the inner terminal 21 has at least one elastic arm (such as the labeled numbers 2121, 2124 formed a cantilevered beam) obliquely extended away from the connecting section 211, which are given the details later.

In this embodiment, to dissipate the heat when transmitting high current, the outer terminal 22, 22' has a plurality of heat-dissipating ribs 2221 formed on the curve portion 222, so as to enlarge a heat-dissipating area of the outer terminals 22, 22'. The heat-dissipating rib 2221 can be formed by punching the curve portion 222, and is protruded from the surface of the curve portion 222 in an integral manner.

Reference is made to FIG. 3, and the detail of the inner terminal is disclosed as follows. The connecting section 211 of the inner terminal 21 has two opposite outer sides, and each outer side has two interfering protrusions 2111 protruded from the conductive portion 221 of the outer terminal 22. In addition, each outer side further has an auxiliary soldering portion 2110 adjacent to the interfering protrusions 2111. In this embodiment, the auxiliary soldering portion 2110 is formed between the two interfering protrusions 2111 and is indentation-shaped, that is concavely formed on the outer side. The auxiliary soldering portion 2110 is non-linear concave-shaped in principle, such as saw-toothed shape, which is advantageous to solder the connecting section 211 of the inner terminal 21 to the conductive portion 221 of the outer terminal 22. The quantity of the interfering protrusion 2111 can be at least one. The interfering protrusion 2111 is advantageous to fix the inner terminal 21 in the insulated housing 10 in an interfering manner, and the auxiliary soldering portion 2110 is advantageous to solder the inner terminal 21 at the outer terminal 22.

In this embodiment, the connecting section 211 of the inner terminal 21 further has a hooking portion 213. The hooking portion 213 can be formed on the connecting section 211 by a punching method, and has a punching hole 2130. The outer terminal 22 further has an opening 2210 formed on the conductive portion 221, and a free end of the hooking portion 213 passes through the opening 2210 of the conductive portion 221 of the outer terminal 22. In detail, the hooking portion 213 is substantially S-shaped, as shown in FIG. 4A. A part of the hooking portion 213 is bent and protruded beyond one side of the connecting section 211, that is, a direction away from the outer terminal 22, and extended into the terminal receiving hole 12 of the insulated housing 10. The hooking portion 213 then bends and extends through the punching hole 2130, and the free end of the hooking portion 213 is extended to the other side of the connecting section 211 through the punching hole 2130, that is, a direction toward the outer terminal 22 and back from the elastic section 212. The free end of the hooking portion 213 is extended into the wedging hole 120 of the insulated housing 10. The hooking portion 213 passes through the opening 2210 of the conductive portion 221 and abuts against the wedging hole 120 of the insulated housing 10, so that the electrical terminal assembly 20, 20' can be fixedly positioned in the insulated housing 10. Therefore, the electrical terminal assembly 20, 20' can be provided with a function of avoiding moving backwards. The electrical terminal assembly 20, 20' are prevented from sliding backwards because of an inserting force of a terminal or a modular card inserted therein.

Figure 4:
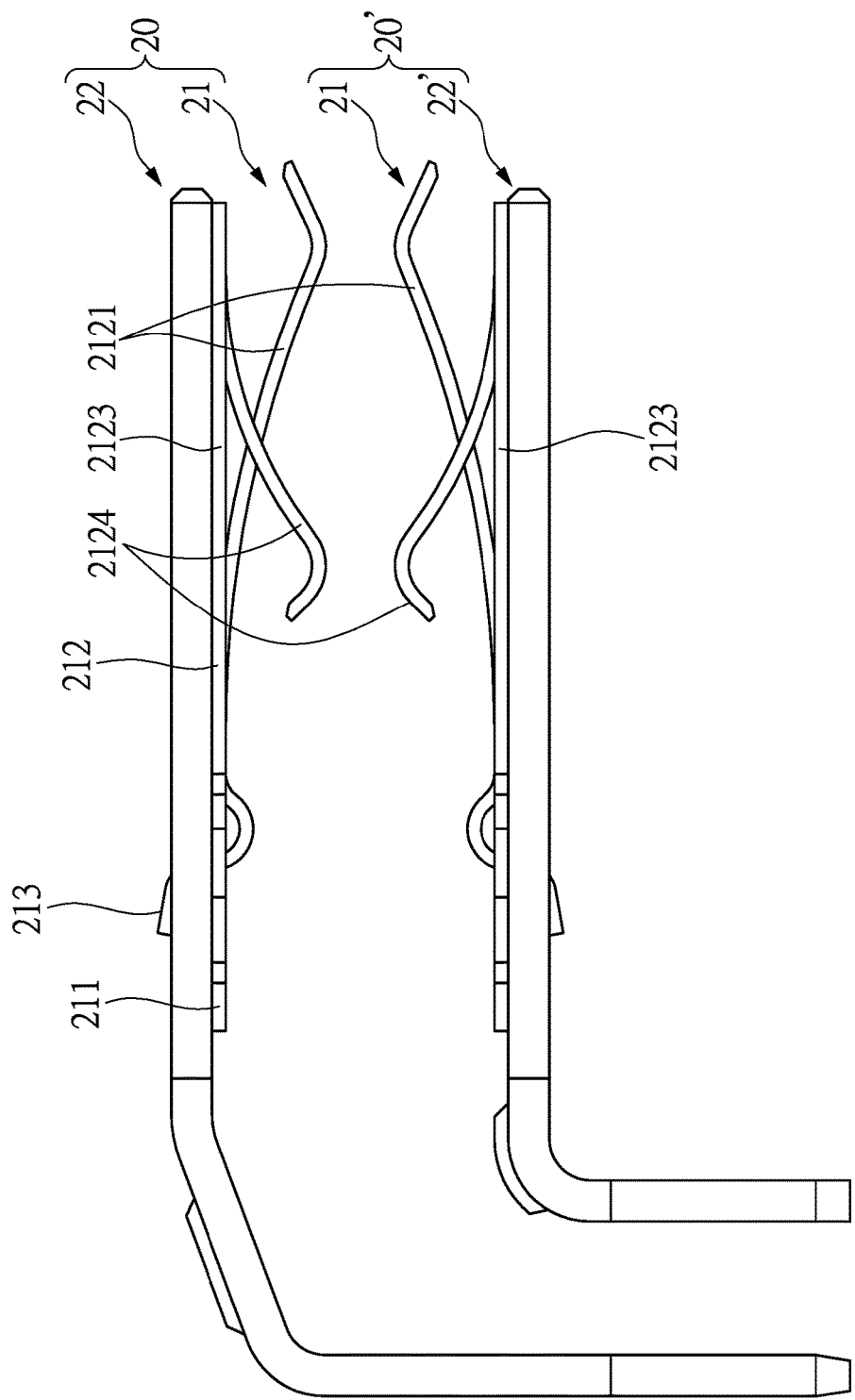
FIG. 4 is a side view of the electrical terminal assembly according to the first embodiment of the present disclosure.
Figure 4A:
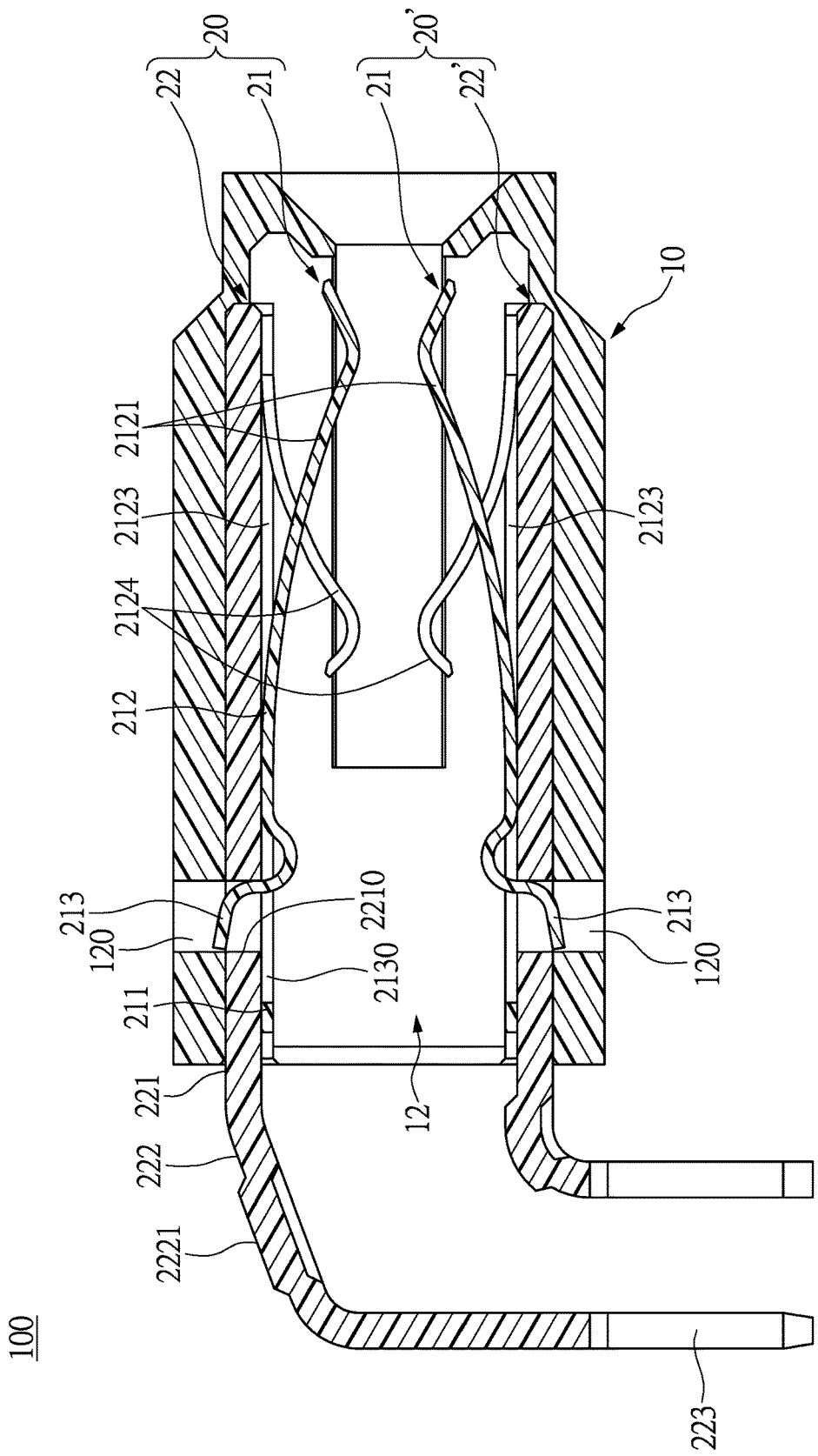
FIG. 4A is a cross-sectional view of the power connector according to the first embodiment of the present disclosure.

Reference is made to FIG. 3 and FIG. 4, and FIG. 4 is a side view of the electrical terminal assembly according to the first embodiment of the present disclosure. In this embodiment, the elastic section 212 of the inner terminal 21 has an elastic arm 2121 extended from the connecting section 211, and a pair of outer arms 2124 extended toward the connecting section 211. The elastic arm 2121 is located between a pair of the outer arms 2124. The elastic arm 2121 is protruded and bent from a middle of one lateral edge of the connecting section 211 outward. The elastic arm 2121 has a bending-shaped contacting portion close to its free end. Two elongation arms 2123 are extended from two ends of the lateral edge of the connecting section 211. The outer arm 2124 is extended and bent from a free end of the elongation arm 2123 toward the connecting section 211.

Reference is made to FIG. 4. The present disclosure has advantages as follows. It can be used in a power connector for transmitting high current, and the elastic section 212 of the inner terminal 21 can elastically clamp the terminal or the modular card of a plugging connector (not shown) to ensure good electricity contacting. The outer terminal 22 or 22' can be mad of a material with higher electric conductivity to transmit a high electric current.

In a preferred embodiment, electrical conductivity of the outer terminal 22, 22' is greater than that of the inner terminal 21. An elastic modulus of the inner terminal 21 is greater than that of the outer terminal 22, 22'. The elastic modulus, also known as the modulus of elasticity, or the Young's modulus (which has units of N/m2), of an object is defined as the ratio of stress to strain in the elastic deformation region. The modulus of elasticity is a number measuring an object or substance's resistance which is to be deformed elastically (i.e., non-permanently). When a force is applied to an object, the modulus of elasticity reflects a degree of an elastic deformation of the object. A material with a very high Young's modulus can be approximately regarded as rigid.

Specifically, the outer terminal 22, 22' is used to transmit a high electric current and preferably made of pure copper. The pure copper is softer and has better malleability, but its mechanical strength is poorer. This embodiment utilizes the inner terminal 21 with a higher Young's modulus to provide a greater clamping force, so as to elastically clamp a terminal or a modular card (not shown) which is inserted into the power connector. The inner terminal 21 preferably can be made of copper alloys, such as brass made of copper and zinc, or bronze consisting primarily of copper and tin, so as to increase the mechanical strength and corrosion resistance. Brass is a metal alloy made of copper and zinc and has a golden color, which is more corrosion-resistant, stronger, and suitable for casting and machining. Bronze is an alloy consisting of copper and other elements, such as tin, aluminum, silicon manganese, nickel or zinc. For example, beryllium-bronze, or beryllium copper alloy has 1.7% to 2.5% beryllium. Beryllium-bronze has high elastic limit, fatigue limit, corrosion resistance and erosion resistance, with good electrical conductivity and heat conductivity. Phosphor bronze is a bronze added with phosphor, which can become an extra hard compound and increase corrosion resistance and erosion resistance, and is suitable for being used as the material of spring. The bronze of ratio about 91-97% copper, 3-9% tin, 0.2% phosphorus, has high hardness with fatigue resistivity.

Second Embodiment

Figure 5:
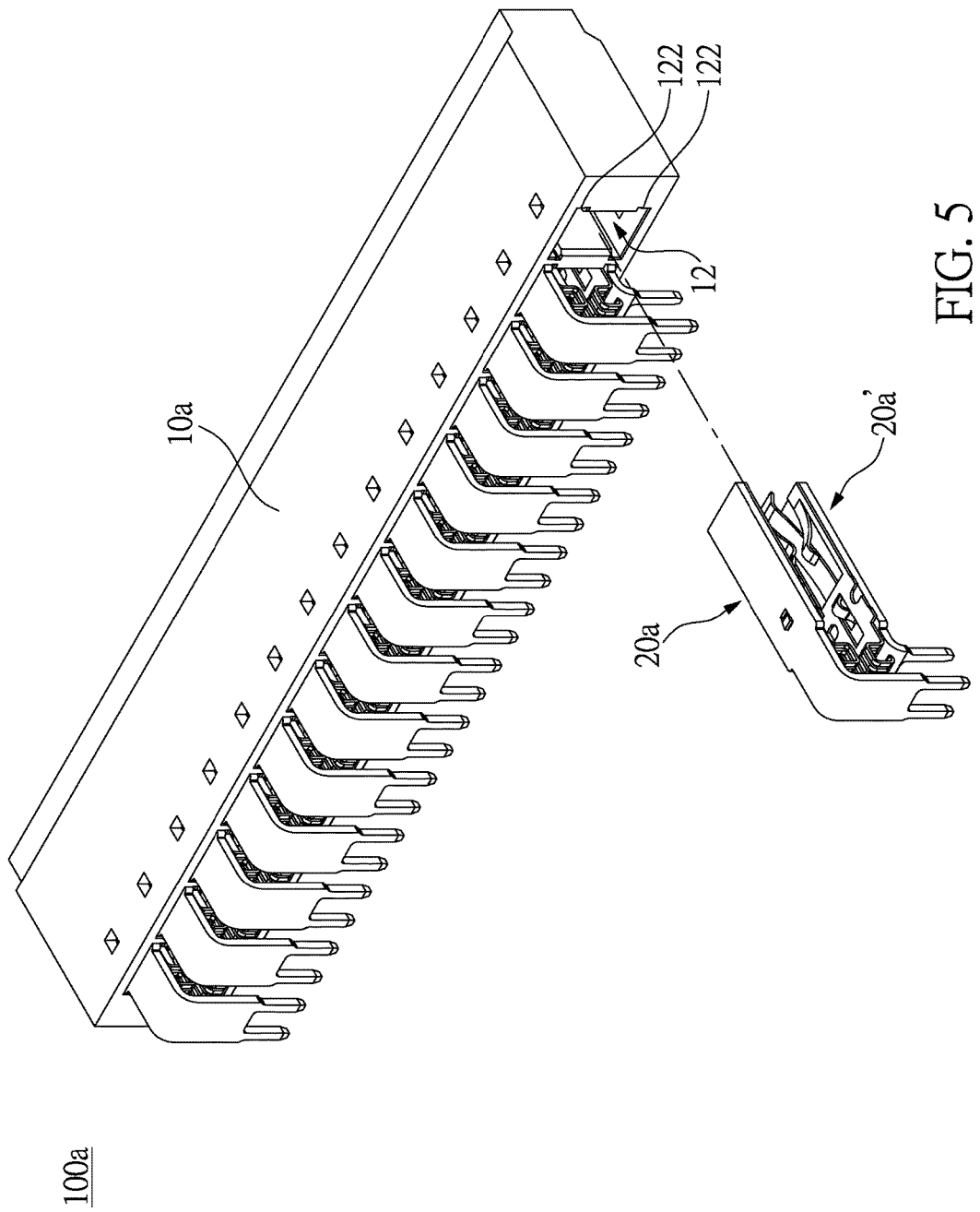
FIG. 5 is an exploded perspective view of the power connector according to a second embodiment of the present disclosure.
Figure 6:
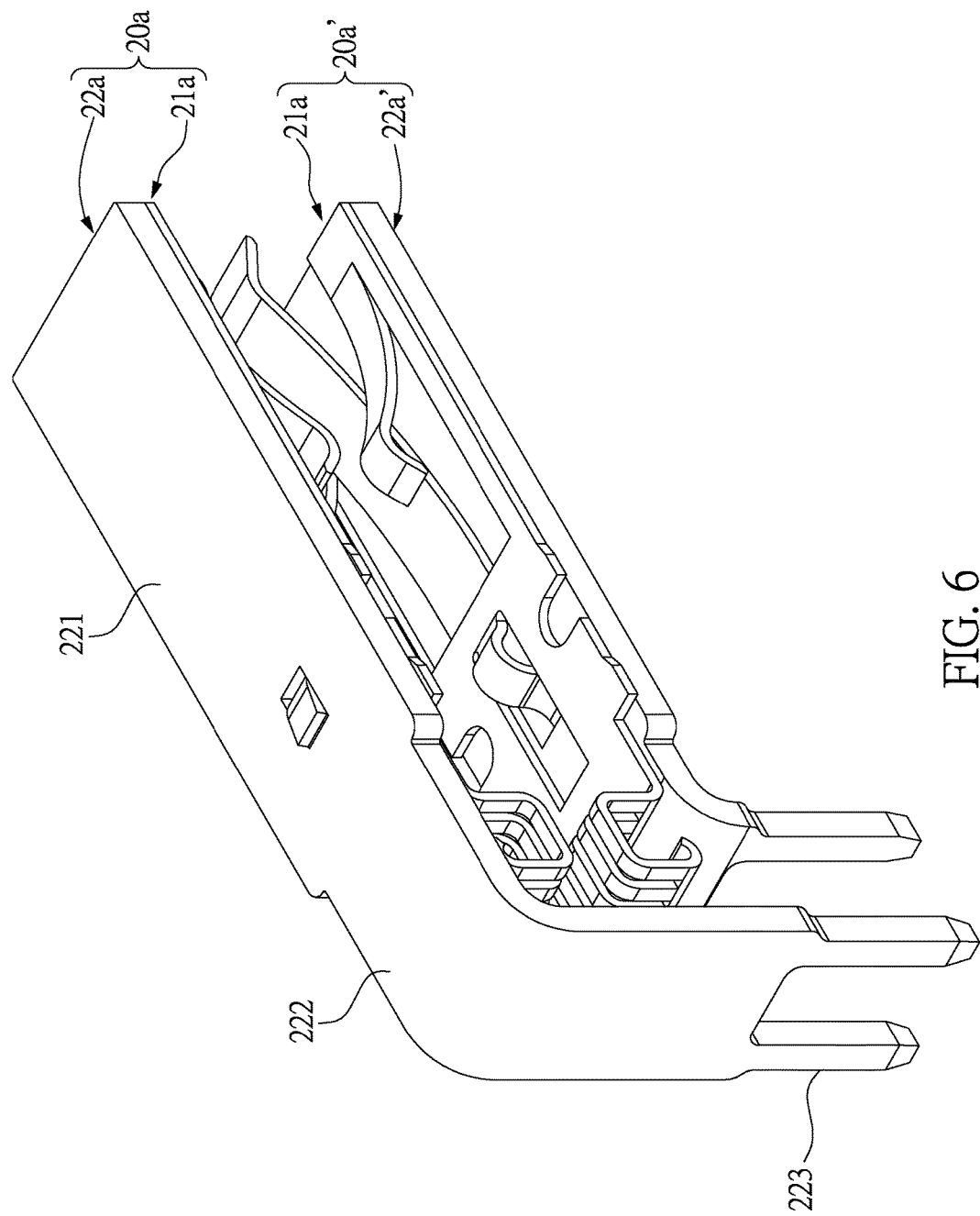
FIG. 6 is a perspective view of the electrical terminal assembly according to the second embodiment of the present disclosure.
Figure 7:
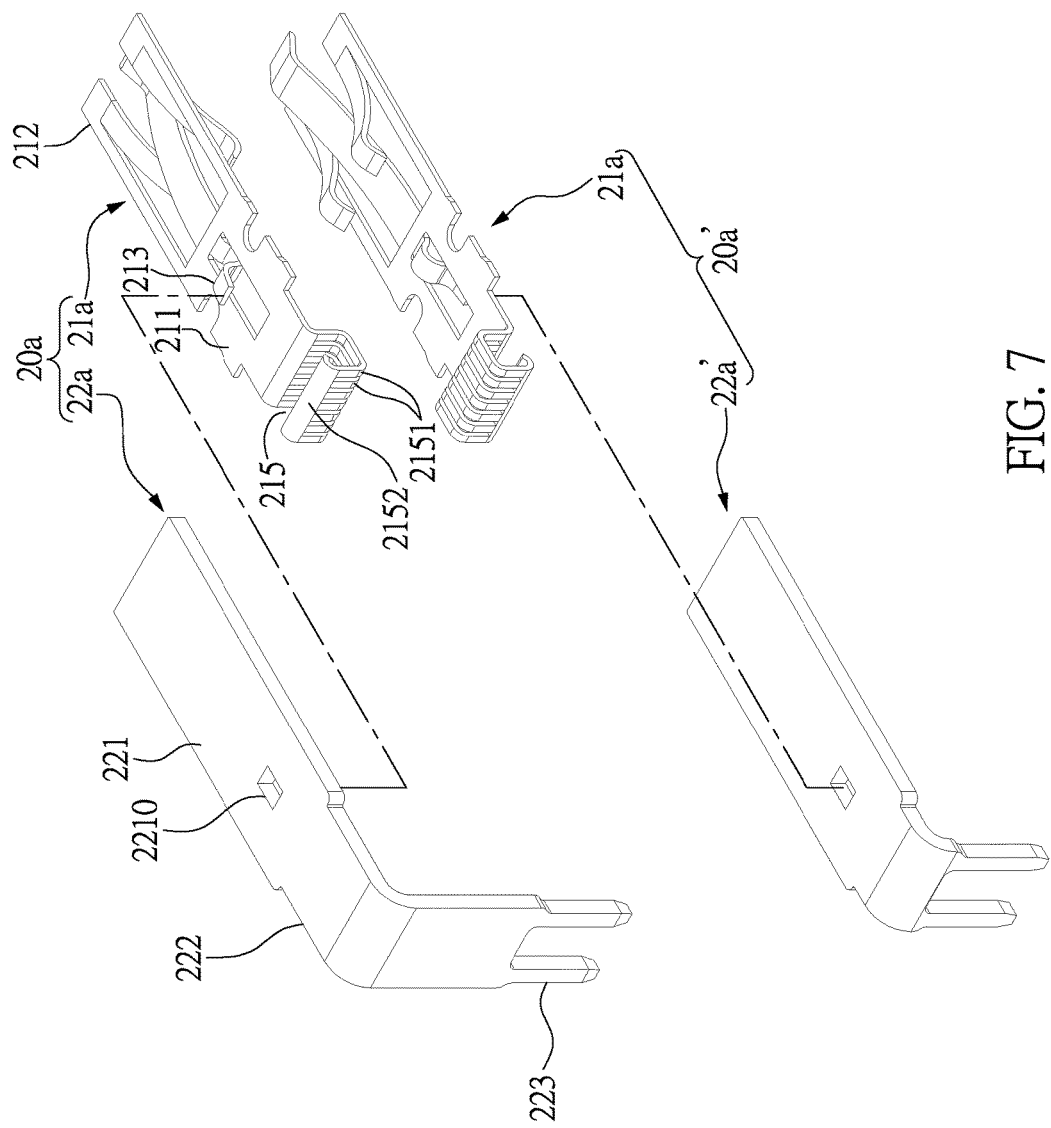
FIG. 7 is an exploded perspective view of the electrical terminal assembly according to the second embodiment of the present disclosure.

Reference is to FIG. 5 and FIG. 6, which are respectively a perspective exploded view of the power connector and a perspective view of the electrical terminal assembly according to a second embodiment. In this embodiment, the power connector 100a has an insulated housing 10a and a plurality of pairs of electrical terminal assembly 20a, 20a'. The insulated housing 10a is formed with a plurality of terminal receiving holes 12. Each pair of the electrical terminal assembly 20a, 20a' has an inner terminal 21a, 21a and an outer terminal 22a, 22a'. Referring to FIG. 7. The inner terminal 21a has a connecting section 211 and an elastic section 212 connected to the connecting section 211. The outer terminal 22a (or 22a') has a conductive portion 221, a leg portion 223 formed at one end of the conductive portion 221, and a curve portion 222 formed between the conductive portion 221 and the leg portion 223.

Figure 8:
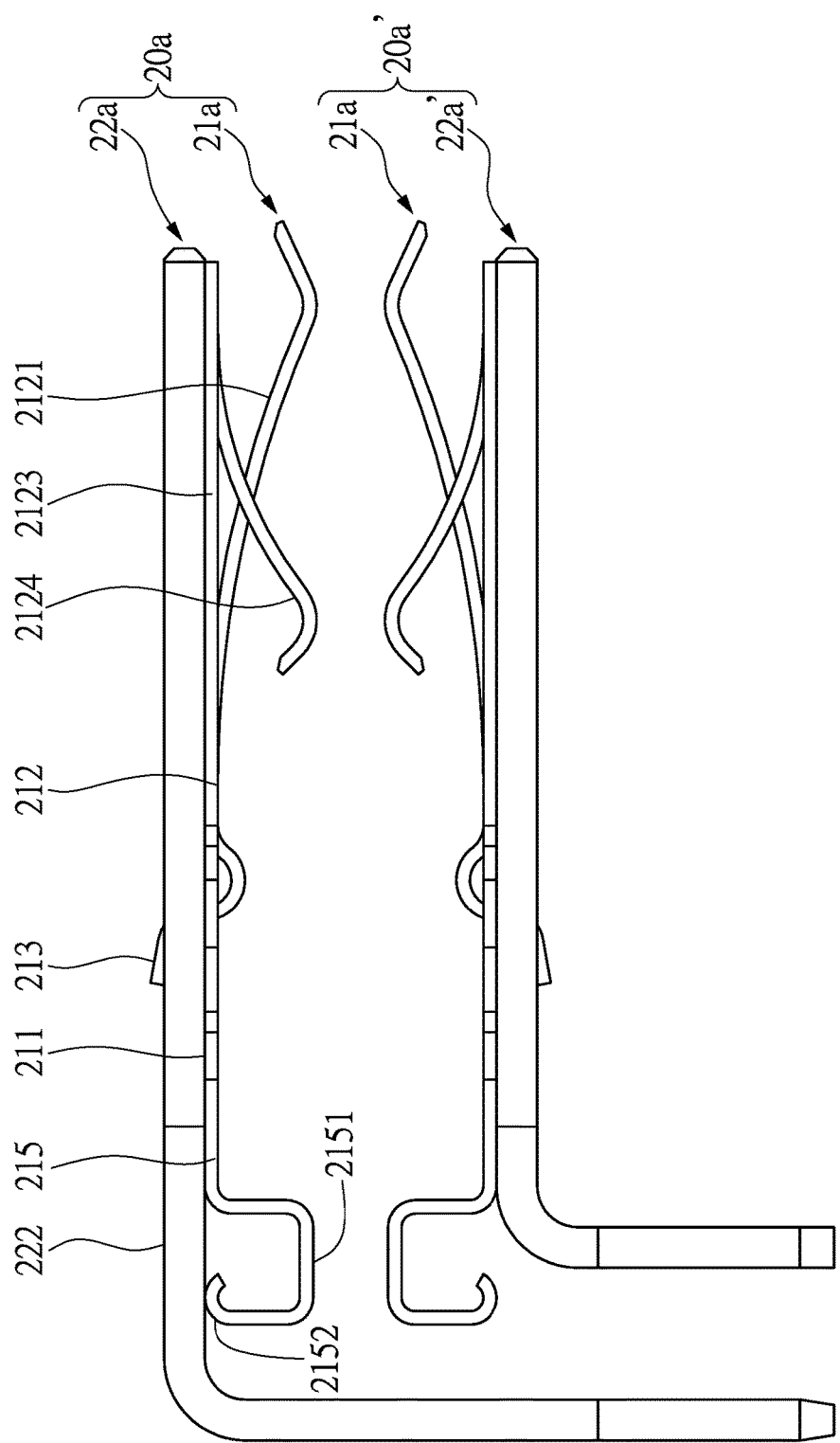
FIG. 8 is a side view of the electrical terminal assembly according to the second embodiment of the present disclosure.

Reference is made to FIG. 7 and FIG. 8. The main difference between this embodiment and the above embodiment is that the inner terminal 21a further has a heat-dissipating section 215. The heat-dissipating section 215 is connected to the connecting section 211 and opposite to the elastic section 212. Each heat-dissipating section 215 has a plurality of parallel heat-dissipating fences 2151 and a folding portion 2152 connected with ends of the heat-dissipating fences 2151. Referring to FIG. 8, the heat-dissipating fence 2151 is substantially U-shaped, and is extended away from the outer terminal 20a (22a'). The heat-dissipating section 215 of this embodiment uses the space between the curve portions 222 well. The folding portion 2152 of the inner terminal 21a at an upper position further abuts against the curve portion 222 of the outer terminal 22a. In this embodiment, the curve portion 222 of the outer terminal 22a has a smooth surface, and also can be formed with a heat-dissipating rib as mentioned in the above embodiment.

Third Embodiment

Figure 9:
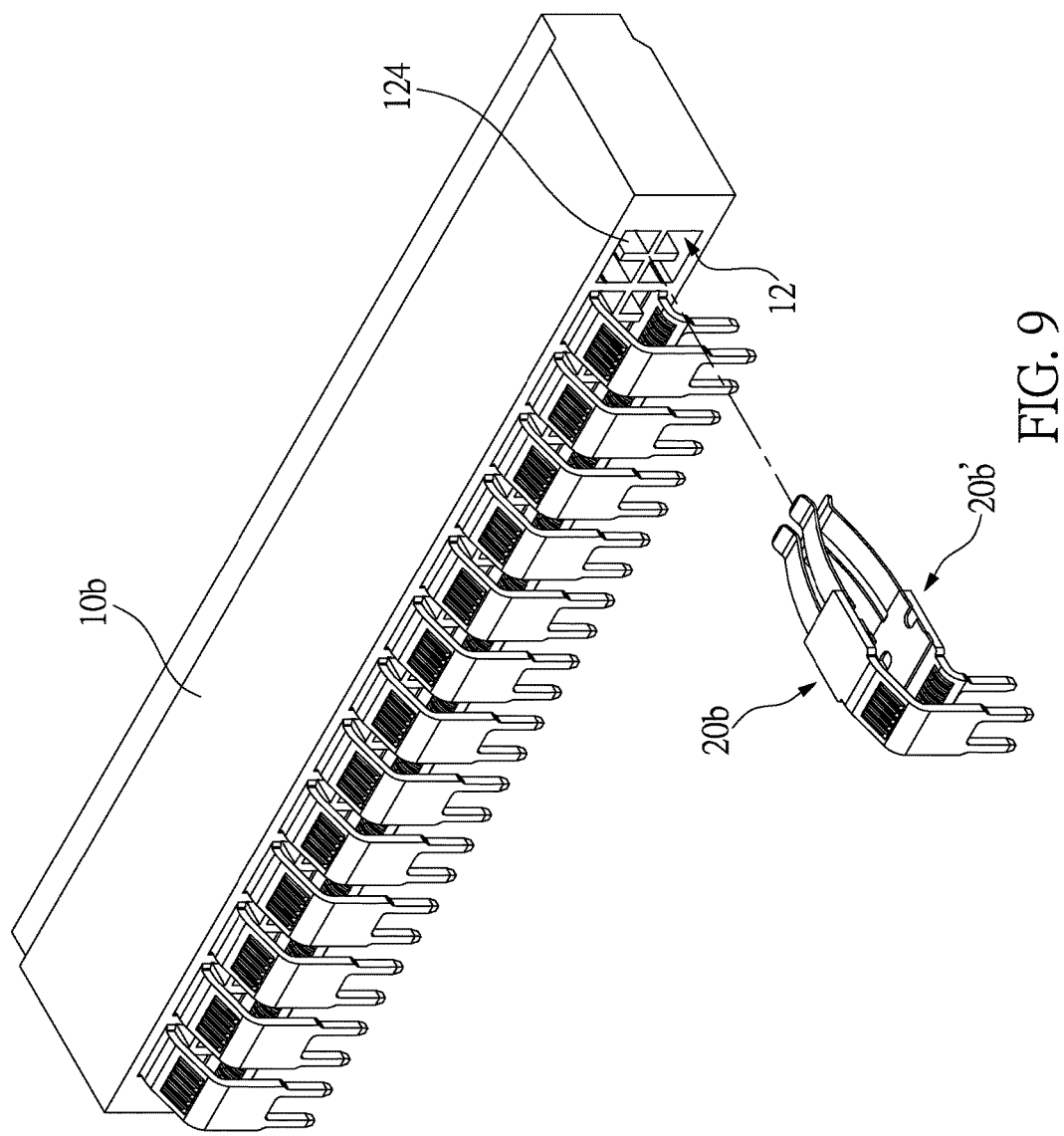
FIG. 9 is an exploded perspective view of the power connector according to a third embodiment of the present disclosure.
Figure 10:
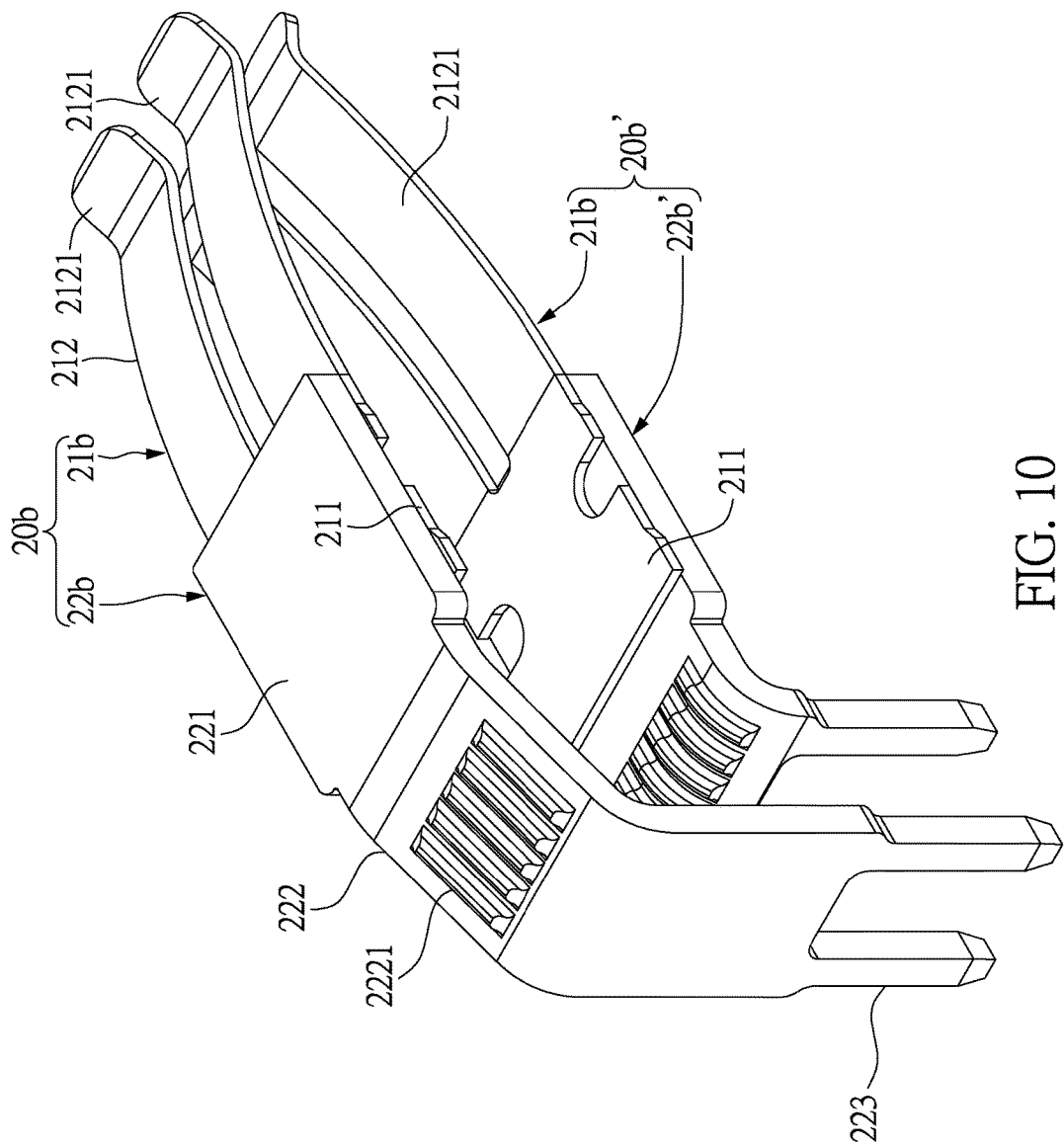
FIG. 10 is a perspective view of the electrical terminal assembly according to the third embodiment of the present disclosure.

Reference is made to FIG. 9 and FIG. 10, which are respectively an exploded perspective view of the power connector and a perspective view of a pair of electrical terminal assemblies according to the third embodiment. In this embodiment, the power connector 100b includes an insulated housing 10b and a plurality of pairs of electrical terminal assemblies 20b, 20b'. The insulated housing 10b has a plurality of terminal receiving holes 12.

Figure 11:
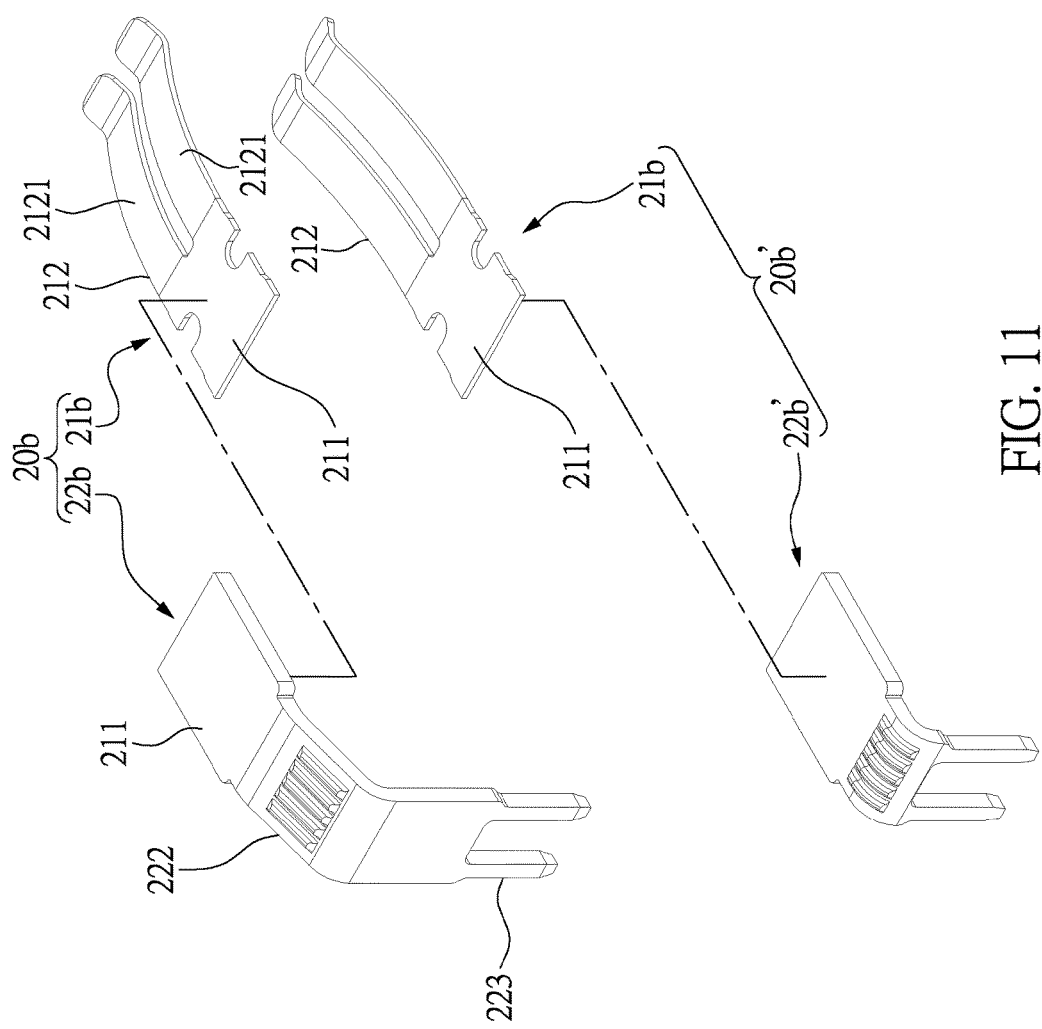
FIG. 11 is an exploded perspective view of the electrical terminal assembly according to the third embodiment of the present disclosure.
Figure 12:
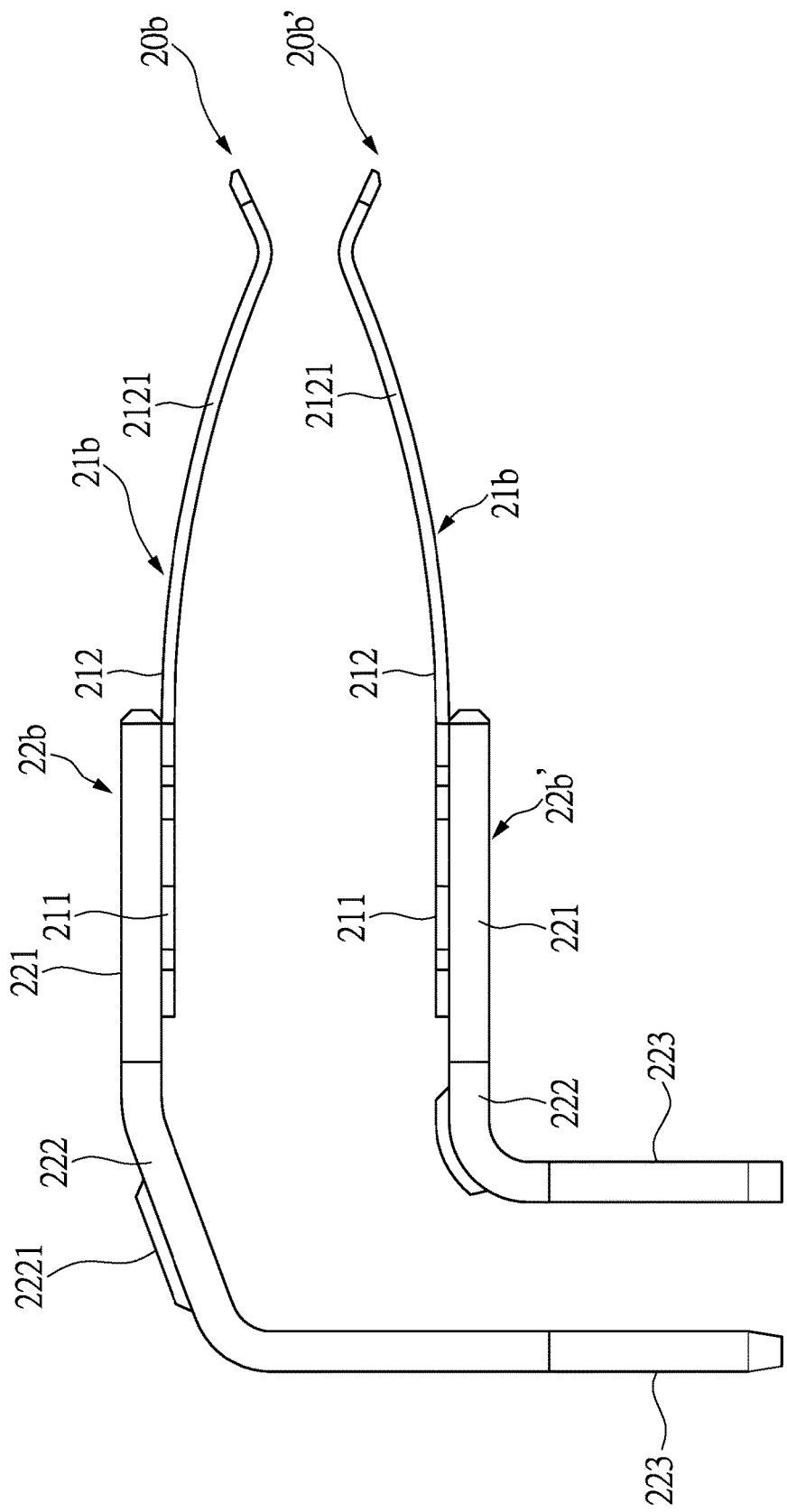
FIG. 12 is a side view of the electrical terminal assembly according to the third embodiment of the present disclosure.

Reference is made to FIG. 11 and FIG. 12, which respectively are an exploded perspective view and a side view of the electrical terminal assembly of the third embodiment. Each pair of the electrical terminal assembly 20b, 20b' has an inner terminal 21b, 21b and an outer terminal 22b, 22b'. The inner terminal 21b has a connecting section 211 and an elastic section 212 connected to the connecting section 211. The outer terminal 22b (or 22b') has a conductive portion 221, a leg portion 223 formed at one end of the conductive portion 221, and a curve portion 222 formed between the conductive portion 221 and the leg portion 223. What is different from the above embodiment is that the elastic section 212 of the inner terminal 21b is extended beyond the conductive portion 221 of the outer terminal 22b (or 22b'), and the elastic section 212 has a pair of elastic arms 2121 extended away from the connecting section. The conductive portion 221 has a length along the longitudinal direction is substantially equal to a length of the connecting section 211 along the longitudinal direction.

The connecting section 211 has a shape as mentioned in the first embodiment. In addition, the curve portion 222 has a plurality of heat-dissipating ribs 2221 as mentioned in the first embodiment.

The advantage of this embodiment is that the conductive portion 221 of the outer terminal 22b (or 22b') is shorter, so that the material of the outer terminal 22b (or 22b') can be saved. Compared with the other embodiments, the elastic arm 2121 of the inner terminal 21b of this embodiment is wider, so as to provide a stronger clamping force.

Fourth Embodiment

Figure 13:
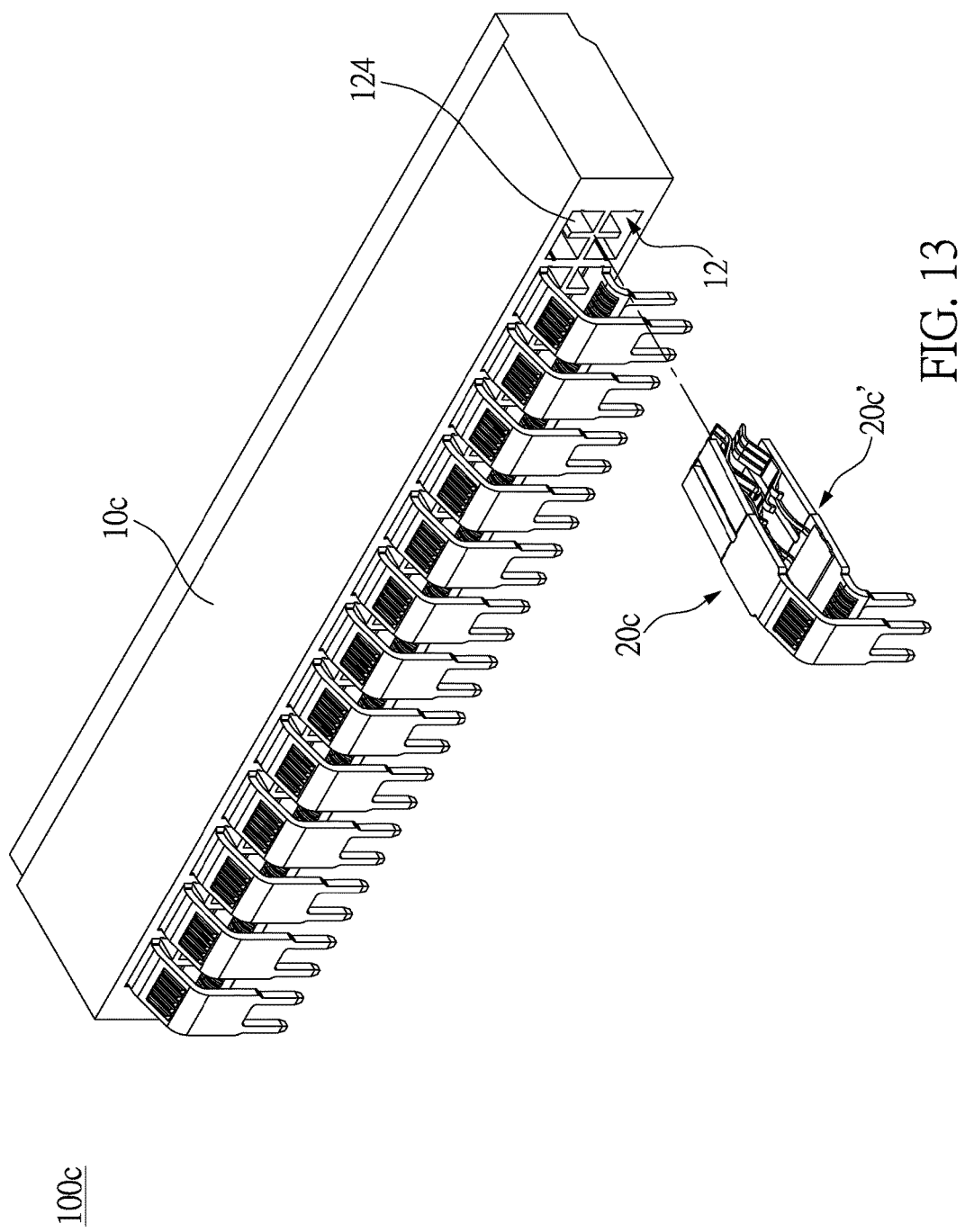
FIG. 13 is an exploded perspective view of the power connector according to a fourth embodiment of the present disclosure.
Figure 14:
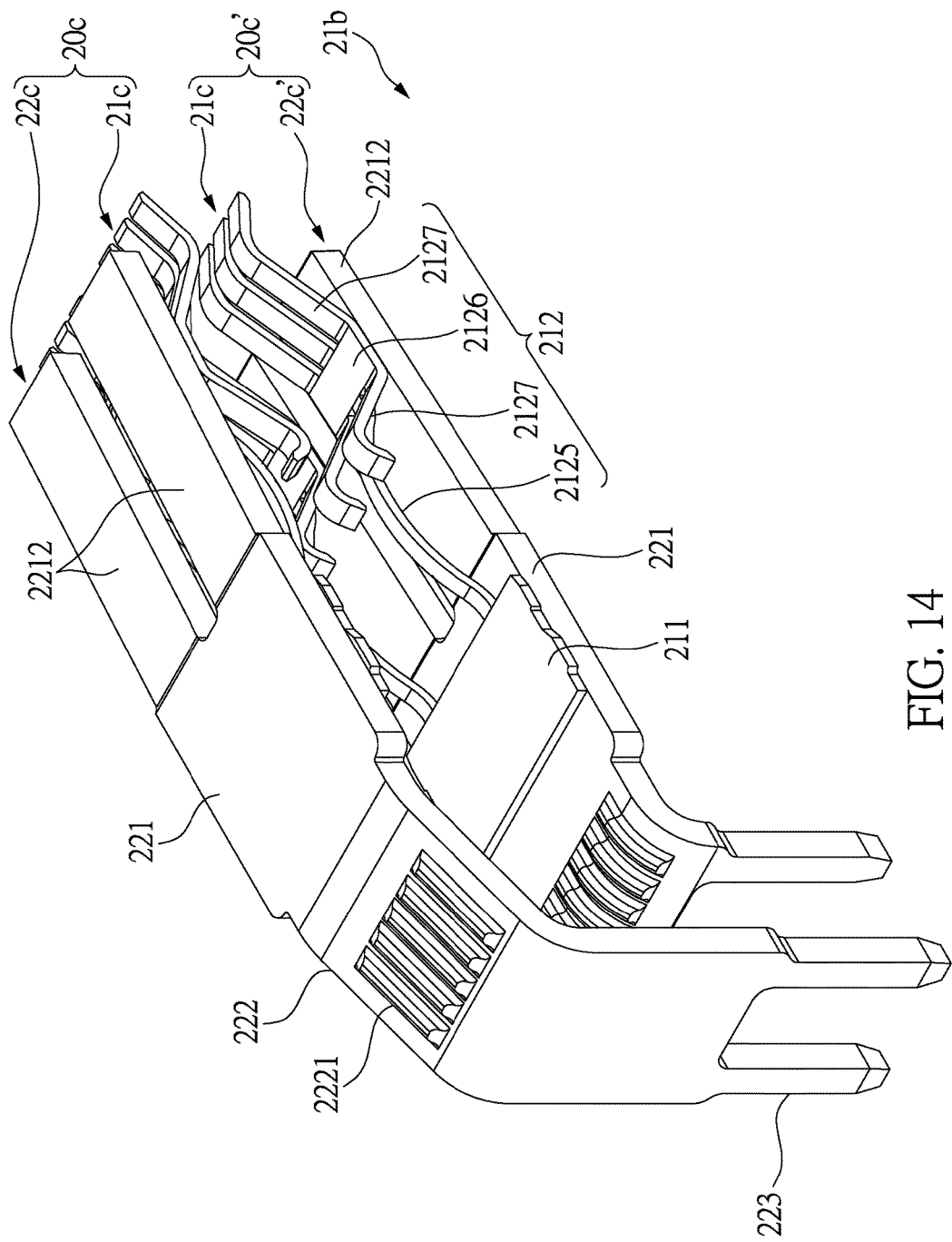
FIG. 14 is a perspective view of the electrical terminal assembly according to the fourth embodiment of the present disclosure.

Reference is made to FIG. 13 and FIG. 14, which are respectively an exploded perspective view of the power connector and a perspective view of the electrical terminal assembly according to the fourth embodiment. In this embodiment, the power connector 100c has an insulated housing 10c and a plurality of electrical terminal assemblies 20c, 20c'. The insulated housing 10c has a plurality of the terminal receiving holes 12.

Figure 15:
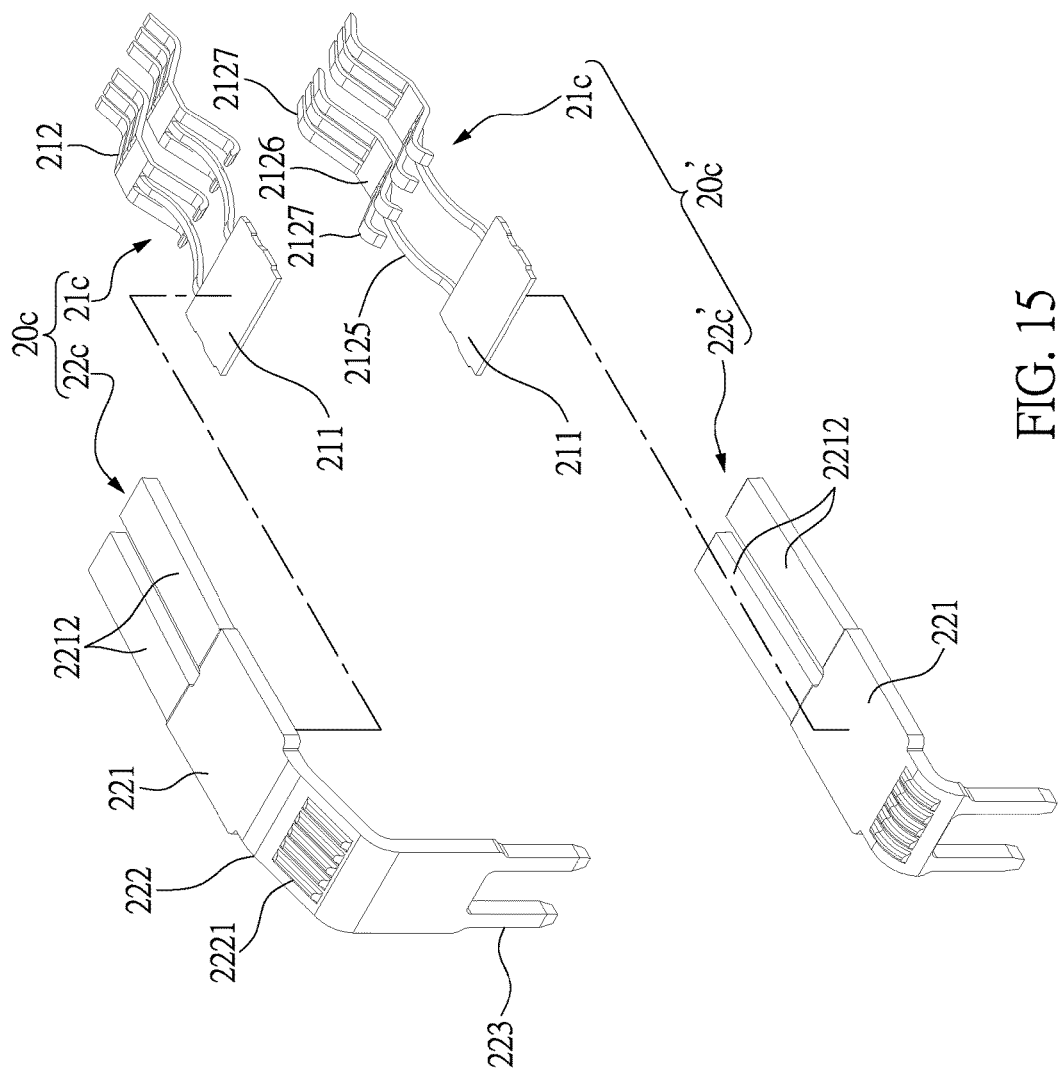
FIG. 15 is an exploded perspective view of the electrical terminal assembly according to the fourth embodiment of the present disclosure.

Reference is made to FIG. 14 and FIG. 15. FIG. 15 is an exploded perspective view of the electrical terminal assembly of the fourth embodiment. Each pair of electrical terminal assemblies 20c, 20c' has an inner terminal 21c, 21c and an outer terminal 22c, 22c'. The inner terminal 21c has a connecting section 211 and an elastic section 212 connected to the connecting section 211. The outer terminal 22c (or 22c') has a conductive portion 221, a leg portion 223 formed at one end of the conductive portion 221, and a curve portion 222 formed between the conductive portion 221 and the leg portion 223. The curve portion 222 has a plurality of heat-dissipating ribs 2221 which are integrally protruded protruding from a surface of the curve portion 222.

Reference is made to FIG. 15. The difference between this embodiment and the above embodiments is that the conductive portion 221 of the outer terminal 22c (or 22c') is a fork-like plate shape, and has a pair of forking arms 2212. The elastic section 212 of the inner terminal 21c has a pair of arc-shaped bridge portions 2125, a pair of abutting portions 2126 respectively connected to the pair of bridge portions 2125 and contacted the pair of forking arms 2212, and a plurality of elastic arms 2127 extended from the abutting portion 2126. In this embodiment, each elastic section 212 has three elastic arms 2127 extended forward, and two elastic arms 2127 extended rearward.

Figure 16:
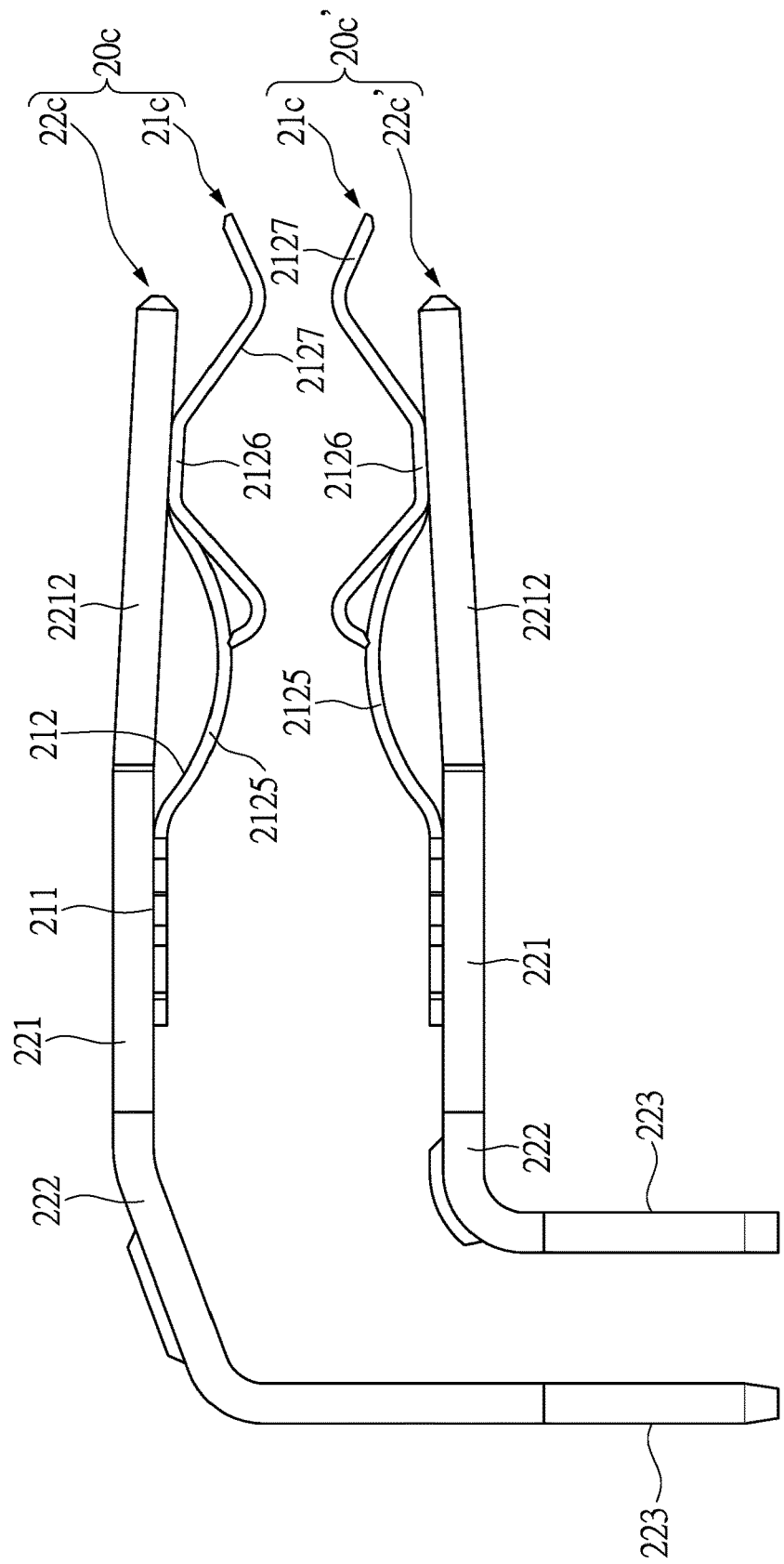
FIG. 16 is a side view of the electrical terminal assembly according to the fourth embodiment of the present disclosure.

Reference is made to FIG. 16 which is a side view of the electrical terminal assembly of the fourth embodiment. Compared with the other embodiments, the forking arm 2212 of this embodiment is slanted toward the elastic section 212, so that the strain on the inner terminal can be shared and the total clamping force can be stronger. In addition, the plurality of elastic arms 2127 have front ends extended beyond the forking arm 2212. The quantity of the elastic arm 2127 of this embodiment is larger than the quantity of the above embodiment.

To sum up, the present disclosure has advantages as follows. The power connector and the electrical terminal assembly according to the embodiments of the present disclosure can be used to transmit high current. The inner terminal has the elastic section which can provide an enough clamping force to elastically clamp the terminal of plug connector or modular card (not shown) to ensure good electrical conduction. The outer terminal is made of a metal material with better electrical conductivity to stably transmit high current. In addition, the inner terminal is thinner which can reduce the insertion force when mating with the module card or plug connector.

The present disclosure further provides the electrical terminal assembly with heat-dissipating structure which can be formed on the outer terminal or the inner terminal. The outer terminal can be formed with a plurality of heat-dissipating ribs which are integrally protruded from the surface of the curve portion. In addition, the inner terminal can have heat-dissipating section extended rearward. Each heat-dissipating section (215) has a plurality of parallel heat-dissipating fences (2151) so as to enlarge the dissipating area.

It should be noted that, in the description herein and throughout the claims that follow, the term "substantially" is used in association with values that may vary slightly and in association with slight deviations that may result from manufacturing processes, in which such minor errors do not change the properties relevant to the values and the characteristics of the elements.

The descriptions illustrated supra set forth simply the preferred embodiments of the present disclosure; however, the characteristics of the present disclosure are by no means restricted thereto. All changes, alterations or modifications conveniently considered by those skilled in the art are deemed to be encompassed within the scope of the present disclosure delineated by the following claims.

What is claimed is:

1. A power connector, comprising:
an insulated housing having at least one terminal receiving hole; and
at least one electrical terminal assembly disposed in the at least one terminal receiving hole; wherein each electrical terminal assembly has:
an inner terminal, having a connecting section and an elastic section formed a cantilevered beam connected to the connecting section,
an outer terminal, having a conductive portion, a leg portion formed at one end of the conductive portion and a curve portion formed between the conductive portion and the leg portion, wherein the leg portion is exposed outside of the insulated housing, and the connecting section of the inner terminal is mechanically connected to the conductive portion of the outer terminal to form an electricity conductive point; wherein the conductive portion of the outer terminal is plate-shaped;
wherein the inner terminal is made of a first material, and the outer terminal is made of a second material different from the first material, an electric conductivity of the second material higher than an electric conductivity of the first material;

wherein an electricity is orderly conducted from the elastic section of the inner terminal, the connecting section of the inner terminal, and the conductive portion of the outer terminal, then out from the leg portion of the outer terminal;

wherein the conductive portion of the outer terminal is plate-shaped and extended to cover the elastic section of the inner terminal;

when the elastic section elastically clamps a terminal or a modular card inserted therein, the elastic section is pressed to contact the conductive portion of the outer terminal.

2. The power connector as claimed in claim 1, wherein the outer terminal has a plurality of heat-dissipating ribs formed on the curve portion.

3. The power connector as claimed in claim 1, wherein an elastic modulus of the inner terminal is greater than that of the outer terminal.

4. The power connector as claimed in claim 1, wherein the connecting section of the inner terminal has two opposite outer sides, and each of the outer sides has an auxiliary soldering portion.

5. The power connector as claimed in claim 1, wherein the inner terminal further has a heat-dissipating section, and the heat-dissipating section is connected to the connecting section and opposite to the elastic section.

6. The power connector as claimed in claim 1, wherein the elastic section of the inner terminal has an elastic arm extended away from the connecting section and a pair of outer arms extended toward the connecting section, and the elastic arm is arranged between the pair of the outer arms.

7. The power connector as claimed in claim 1, wherein the elastic section of the inner terminal is extended beyond the conductive portion of the outer terminal, and the elastic section has a pair of elastic arms extended away from the connecting section.

8. The power connector as claimed in claim 1, wherein the conductive portion of the outer terminal is a fork-like shape, and has a pair of forking arms, wherein the elastic section of the inner terminal has a pair of arc-shaped bridge portion, a pair of abutting portions respectively connected to the pair of the bridge portions and respectively abutted against the pair of forking arms, and a plurality of elastic arms extended from the abutting portion.

9. The power connector as claimed in claim 8, wherein the forking arm is slanted to the elastic section.

10. The power connector as claimed in claim 1, wherein a quantity of the electrical terminal assembly is a pair and arranged oppositely to each other, and a square-shaped slot is defined between the pair of the outer terminals.

11. An electrical terminal assembly, received in a terminal receiving hole of an insulated housing, and the electrical terminal assembly comprising:
an inner terminal, having a connecting section and an elastic section formed a cantilevered beam connected to the connecting section,
an outer terminal, having a conductive portion, a leg portion formed at one end of the conductive portion and a curve portion connected the conductive portion and the leg portion, wherein the conductive portion is plate-shaped, the leg portion is exposed beyond the insulated housing, and the connecting section of the inner terminal is mechanically connected to the conductive portion of the outer terminal to form an electricity conductive point;

wherein the inner terminal is made of a first material, and the outer terminal is made of a second material different from the first material, an electric conductivity of the second material higher than an electric conductivity of the first material;

wherein an electricity is orderly conducted from the elastic section of the inner terminal, the connecting section of the inner terminal, and the conductive portion of the outer terminal, then out from the leg portion of the outer terminal;

wherein the conductive portion of the outer terminal is plate-shaped and extended to cover the elastic section of the inner terminal;

when the elastic section elastically clamps a terminal or a modular card inserted therein, the elastic section is pressed to contact the conductive portion of the outer terminal.

12. The electrical terminal assembly as claimed in claim 11, wherein the outer terminal has a plurality of heat-dissipating ribs formed on the curve portion.

13. The electrical terminal assembly as claimed in claim 11, wherein an elastic modulus of the inner terminal is greater than that of the outer terminal.

14. The electrical terminal assembly as claimed in claim 11, wherein the connecting section of the inner terminal has two opposite outer sides, and each of the outer sides has an auxiliary soldering portion.

15. The electrical terminal assembly as claimed in claim 11, wherein the inner terminal further has a heat-dissipating section, and the heat-dissipating section is connected to the connecting section and opposite to the elastic section.

16. The electrical terminal assembly as claimed in claim 11, wherein the elastic section of the inner terminal has an elastic arm extended away from the connecting section and a pair of outer arms extended toward the connecting section, and the elastic arm is arranged between the pair of the outer arms.

17. The electrical terminal assembly as claimed in claim 11, wherein the elastic section of the inner terminal is extended beyond the conductive portion of the outer terminal, and the elastic section has a pair of elastic arms extended away from the connecting section.

18. The electrical terminal assembly as claimed in claim 11, wherein the conductive portion of the outer terminal is a fork-like shape, and has a pair of forking arms, wherein the elastic section of the inner terminal has a pair of arc-shaped bridge portion, a pair of abutting portions respectively connected to the pair of the bridge portions and respectively abutted against the pair of forking arms, and a plurality of elastic arms extended from the abutting portion.

19. The electrical terminal assembly as claimed in claim 18, wherein the forking arm is slanted to the elastic section.

20. The power connector as claimed in claim 11, wherein a quantity of the electrical terminal assembly is a pair and arranged oppositely to each other, and a square-shaped slot is defined between the pair of the outer terminals.

* * * * *